(12) United States Patent
Shinohara et al.

(10) Patent No.: US 6,239,474 B1
(45) Date of Patent: May 29, 2001

(54) INTEGRATION TYPE PHOTOVOLTAIC APPARATUS AND METHOD OF FABRICATING THE SAME

(75) Inventors: Wataru Shinohara, Katano; Hisaki Tarui, Shijyounawate, both of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/160,191

(22) Filed: Sep. 25, 1998

(30) Foreign Application Priority Data

Sep. 26, 1997 (JP) .................................................... 9-261881

(51) Int. Cl.⁷ ........................ H01L 31/00; H01L 29/04; H01L 31/20; H01L 31/036; H01L 31/0376
(52) U.S. Cl. ........................ 257/447; 136/252; 136/261; 257/53; 257/431; 257/460
(58) Field of Search ..................... 136/252, 256, 136/261; 257/53, 431, 437, 447, 460

(56) References Cited

U.S. PATENT DOCUMENTS

| | | | |
|---|---|---|---|
| 4,691,077 | * | 9/1987 | Gregory et al. ...................... 136/256 |
| 4,828,628 | * | 5/1989 | Hezel et al. .......................... 136/255 |
| 4,956,023 | * | 9/1990 | Tsuge et al. .......................... 136/244 |
| 5,399,441 | * | 3/1995 | Bearinger et al. .................... 428/689 |
| 5,458,912 | * | 10/1995 | Camilletti et al. ................. 427/126.4 |
| 5,527,716 | * | 6/1996 | Kusian et al. ......................... 438/74 |
| 5,595,607 | | 1/1997 | Wenham et al. ..................... 136/244 |

FOREIGN PATENT DOCUMENTS

| | | |
|---|---|---|
| 0 422 511 | 4/1991 | (EP) . |
| 0 482 511 | 4/1992 | (EP) . |

* cited by examiner

Primary Examiner—Eddie C. Lee
Assistant Examiner—Allan R. Wilson
(74) Attorney, Agent, or Firm—Arent Fox Kintner Plotkin & Kahn, PLLC

(57) ABSTRACT

The present invention is to prevent a back metal electrode film from being insufficiently processed even if an amorphous silicon related material film is thinned, wherein a transparent conductive film 2, an amorphous silicon related material film 3, and a back metal electrode film 4 are formed in this order on one main surface of a light transmissive insulation substrate 1, a brittle film 5 having higher hardness than that of the back metal electrode film 4 in at least a fused state is provided on the back metal electrode film 4, and an energy beam is irradiated from the other main surface of the light transmissive insulation substrate 1, to remove the amorphous silicon related material film 3, the back metal electrode film 4, and the brittle film 5.

10 Claims, 7 Drawing Sheets

Laser beam

Laser beam

ITO(1000Å) — 5
METAL FILM — 4
SEMICONDUCTOR FILM — 3
TRANSPARENT ELECTRODE — 2
GLASS SUBSTRATE — 1

LASER BEAM

OPEN VOLTAGE OF REFERENCE 1cm SQUARE

ILLUMINANCE: 10000 lux

EACH STAGE OF INTEGRATION TYPE
(12 STAGES)

LASER BEAM

LASER BEAM

INTEGRATION TYPE PHOTOVOLTAIC APPARATUS AND METHOD OF FABRICATING THE SAME

BACKGROUND OF THE INVENTION

1. Field of the Invention

The present invention relates to an integration type photovoltaic apparatus using an amorphous silicon related material film and a method of fabricating the same.

2. Description of the Prior Art

In recent years, a photovoltaic apparatus using an amorphous silicon related material film as a photoactive layer has been employed for a variety of applications. This owes much to the development of an integration type amorphous silicon (a-Si) photovoltaic apparatus so adapted that a high voltage is taken out by making cascade connection of a lot of photoelectric converting elements on one substrate.

A general a-Si photovoltaic apparatus is formed by laminating on a glass substrate a transparent conductive film, p-type, i-type and n-type a-Si films, and a back metal electrode film in this order. In the integration type a-Si photovoltaic apparatus, cascade connection of a lot of photoelectric converting elements is made such that a high voltage is taken out of one substrate as a whole.

In order to form an integration type structure; the transparent conductive film, the a-Si film, and the metal electrode film on the glass substrate must be separated from each other. As a method of separating the respective films, a laser patterning method using a laser has been mainly used (see U.S. Pat. No. 4,650,524, for example).

A conventional method of fabricating an integration type photovoltaic apparatus using a laser patterning method will be described in accordance with FIGS. 5A to 5E. FIGS. 5A to 5E are enlarged cross-sectional views of a principal part showing the steps of the conventional method of fabricating an integration type photovoltaic apparatus, each illustrating as its center an adjacent spacing portion where two photoelectric converting elements are electrically connected in series.

A transparent conductive film 102 composed of ITO ($In_2Sn_2O_3$), $SnO_2$, etc. is formed on one main surface of a light transmissive insulation substrate 101 composed of glass, etc. The transparent conductive film 102 is divided in a strip shape into an arbitrary number of stages by irradiation of a laser beam, for example (see FIG. 5A). An amorphous silicon related material film 103 composed of a-Si having a pin junction inside thereof is deposited on the divided transparent conductive film 102 (see FIG. 5B).

Thereafter, a laser beam is irradiated along a dividing line of the transparent conductive film 102 such that it is not overlapped with the dividing line from the other main surface of the substrate 101, to radially discharge hydrogen inside the amorphous silicon related material film 103, and the amorphous silicon related material film 103 is removed by the discharge of hydrogen, to divide the amorphous silicon related material film 103 (see FIG. 5C).

A back metal electrode film 104 composed of aluminum, etc. is then formed on the amorphous silicon related material film 103, to connect the transparent conductive film 102 and the back metal electrode film 104 (see FIG. 5D). Thereafter, a laser beam is irradiated along the dividing lines of the transparent conductive film 102 and the amorphous silicon related material film 103 such that it is not overlapped with both the dividing lines from the other main surface of the substrate 101, to rapidly discharge hydrogen inside the amorphous silicon related material film 103, and the amorphous silicon related material film 103 and the back metal electrode film 104 formed thereon are removed by the discharge of hydrogen, to separate adjacent cells (see FIG. 5E).

As the thickness of the amorphous silicon related material film is optimized with measures to prevent degradation by light and improvement in conversion efficiency, and a lamination type photovoltaic apparatus using a narrowband gap material is developed, the amorphous silicon related material film is thinned.

As the amorphous silicon related material film is thinned, the absolute amount of hydrogen inside the amorphous silicon related material film is insufficient in patterning the back metal electrode film, so that the back metal electrode film is not completely removed. Particularly when the thickness of the amorphous silicon related material film is not more than 4000 angstroms, insufficient processing due to lack of the absolute amount of hydrogen inside the amorphous silicon related material film becomes significant. That is, as shown in FIGS. 6A and 6B, a residue 105 is left at an end of a removed part of the back metal electrode film, so that sufficient characteristics cannot be obtained. FIG. 6A is a cross-sectional view of a principal part showing a separating portion between cells, and FIG. 6B is a schematic view showing an optical microscopic image in the separating portion between cells.

On the other hand, a method of thinning the back metal electrode film is considered in order that the amorphous silicon related material film and the back metal electrode film can be removed even by a small dynamic function. If the thickness of the back metal electrode film is decreased, however, the heat radiation effect due to heat conduction in irradiating a laser beam is reduced, so that the end of the back metal electrode film is thermally deformed, and a fused scattered material adheres to the removed part of the back metal electrode film again, for example.

The results of simulation of the temperature distribution in the direction of depth in a case where aluminum (Al), for example, is used as a material of the back metal electrode film, and a Nd:YAG laser is irradiated at an energy density of $5 \times 10^7$ W/cm$^2$ from an amorphous silicon semiconductor layer are shown in FIGS. 7 and 8. FIGS. 7 and 8 are diagrams respectively showing the results of simulation of the temperature distribution in the direction of depth in a case where the thickness of the back metal electrode film is 6000 angstroms and the results of simulation of the temperature distribution in the direction of depth in a case where the thickness of the back metal electrode film is 3000 angstroms. These drawings indicate that if the thickness of the back metal electrode film is decreased from 6000 angstroms to 3000 angstroms, the whole of the back metal electrode film is completely fused in excess of its melting point. As a result, the end of the back metal electrode film warps upward, and the fused scattered portion adheres to the inside of a separating groove again, as shown in FIGS. 9A and 9B. FIG. 9A is a cross-sectional view of a principal part showing a separating portion between cells in a case where the back metal electrode film having a thickness of 3000 angstroms is used, and FIG. 9B is a schematic view showing an optical microscopic image in the separating portion between cells.

As a result, the reliability of the separating portion between cells in the back metal electrode film is degraded, as shown in FIG. 10. When an integration type photovoltaic apparatus comprised of 12 stages is formed, an open voltage varies more greatly, as compared with an open voltage of a cell having a small area (hereinafter referred to as a reference 1 cm square) which does not require separation by a laser beam. This is the result of short caused by the contact of the warping, for example, at an end of the separating portion of the back metal electrode film with the other end.

SUMMARY OF THE INVENTION

The present invention has been made in view of the above-mentioned problems and has for its object to provide an integration type photovoltaic apparatus for preventing a back metal electrode film from being insufficiently processed even if an amorphous silicon related material film is thinned, and a method of fabricating the same.

An integration type photovoltaic apparatus according to the present invention comprises a transparent conductive film divided for each of a plurality of photoelectric converting regions and arranged on one main surface of a light transmissive insulation substrate, an amorphous silicon related material film provided on the transparent conductive film divided by irradiation of an energy beam from the other main surface of the light transmissive insulation substrate, a back metal electrode film provided on the amorphous silicon related material film divided by irradiation of the energy beam from the other main surface of the light transmissive insulation substrate, and a brittle film provided on the back metal electrode film divided by irradiation of the energy beam from the other main surface of the light transmissive insulation substrate and having higher hardness than that of the back metal electrode film in a fused state.

According to the above-mentioned invention, the back metal electrode film is held in the hard and brittle film, so that an end of a separating portion of the back metal electrode film does not warp upward, and a fused scattered material does not adhere to the inside of a separating groove again, thereby making it possible to separate the back metal electrode film. As a result, it is possible to provide an integration type photovoltaic apparatus capable of preventing the back metal electrode film from being insufficiently processed even if the amorphous silicon related material film is thinned as well as having high reliability.

The present invention is particularly suitable for a case where the thickness of the amorphous silicon related material film is not more than 4000 angstroms.

The back metal electrode film may be formed of an electrical conductive material.

The back metal electrode film may be formed of a material selected from materials having an electrical resistivity of not more than $50.0\ \mu\Omega\cdot$ cm at an ordinary temperature (30 K), for example, Au, Ag, Al, Cu, and Ti.

The brittle film may be formed of a material selected from a metal oxide, a metal nitride, and a metal carbide.

The brittle film may be formed of a material selected from $SnO_2$, $Sn_2O_3$, $In_2Sn_2O_3$, $SnO_2$, $ZnO$, $TiO_2$, $Al_2O_3$, and $SiO_2$, a material selected from AlN, TiN, $Ti_2N$, ZrN, and $Si_3N_4$, or a material selected from TiC and SiC.

A method of fabricating an integration type photovoltaic apparatus according to the present invention is a method of fabricating an integration type photovoltaic apparatus in which a transparent conductive film, an amorphous silicon related material film, and a back metal electrode film are formed in this order on one main surface of a light transmissive insulation substrate, characterized by comprising the steps of providing a brittle film having higher hardness than that of the back metal electrode film in at least a fused state on the back metal electrode film, irradiating an energy beam from the other main surface of the light transmissive insulation substrate, and removing the amorphous silicon related material film, the back metal electrode film, and the brittle film.

The present invention is particularly suitable for a case where the thickness of the amorphous silicon related material film is not more than 4000 angstroms.

The present invention is characterized in that the back metal electrode film is formed of an electrical conductive material, and the brittle film is formed of a material selected from a metal oxide, a metal nitride, and a metal carbide.

Furthermore, the brittle film may be formed of a material selected from $SnO_2$, $Sn_2O_3$, $In_2Sn_2O_3$, $SnO_2$, $ZnO$, $TiO_2$, $Al_2O_3$, and $SiO_2$, a material selected from AlN, TiN, $Ti_2N$, ZrN, and $Si_3N_4$, or TiC or SiC.

According to the above-mentioned invention, the back metal electrode film is scattered in a state where it is held in the hard and brittle film, so that an end of a separating portion of the back metal electrode film 5 does not warp upward, and a fused scattered material does not adhere to the inside of a separating groove again, thereby making it possible to separate the back metal electrode film. As a result, even if the amorphous silicon related material film is thinned, it is possible to prevent the back metal electrode film from being insufficiently processed.

The foregoing and other objects, features, and aspects and advantages of the present invention will become more apparent from the following detailed description of the present invention when taken in conjunction with the accompanying drawings.

DESCRIPTION OF THE PREFERRED EMBODIMENT

An integration type photovoltaic apparatus using a laser patterning method according to an embodiment of the present invention will be described in accordance with a method of fabricating the same.

An embodiment of the present invention is applied to an integration type photovoltaic apparatus having a so-called tandem structure obtained by making a-Si and a-SiGe multilayered as an amorphous silicon related material film.

FIGS. 1A to 1E are enlarged cross-sectional views of a principal part showing the steps of a method of fabricating an integration type photovoltaic apparatus according to the present invention, each illustrating as its center an adjacent spacing portion where two photoelectric converting elements are electrically connected in series. FIG. 2 is an enlarged cross-sectional view of a principal part showing the integration type photovoltaic apparatus according to the present invention.

A transparent conductive film 2 composed of $SnO_2$ having a thickness of 0.2 to 1 μm (approximately 1 μm in the present embodiment) is formed by thermal CVD (Chemical Vapor Deposition) or the like on one main surface of a light transmissive insulation substrate 1 composed of glass. Thereafter, the transparent conductive film 2 is divided in a strip shape into arbitrary stages by irradiation of a laser beam, for example (see FIG. 1A).

Figure 1A:
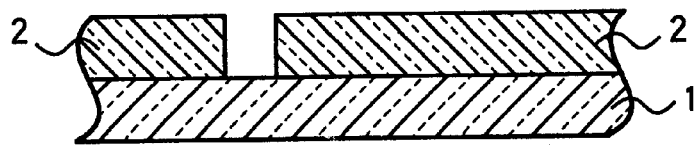
FIGS. 1A to 1E are enlarged cross-sectional views of a principal part showing the steps of a method of fabricating an integration type photovoltaic apparatus according to the present invention.
Figure 1B:
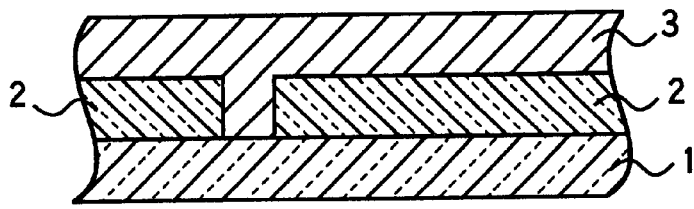
Figure 2:
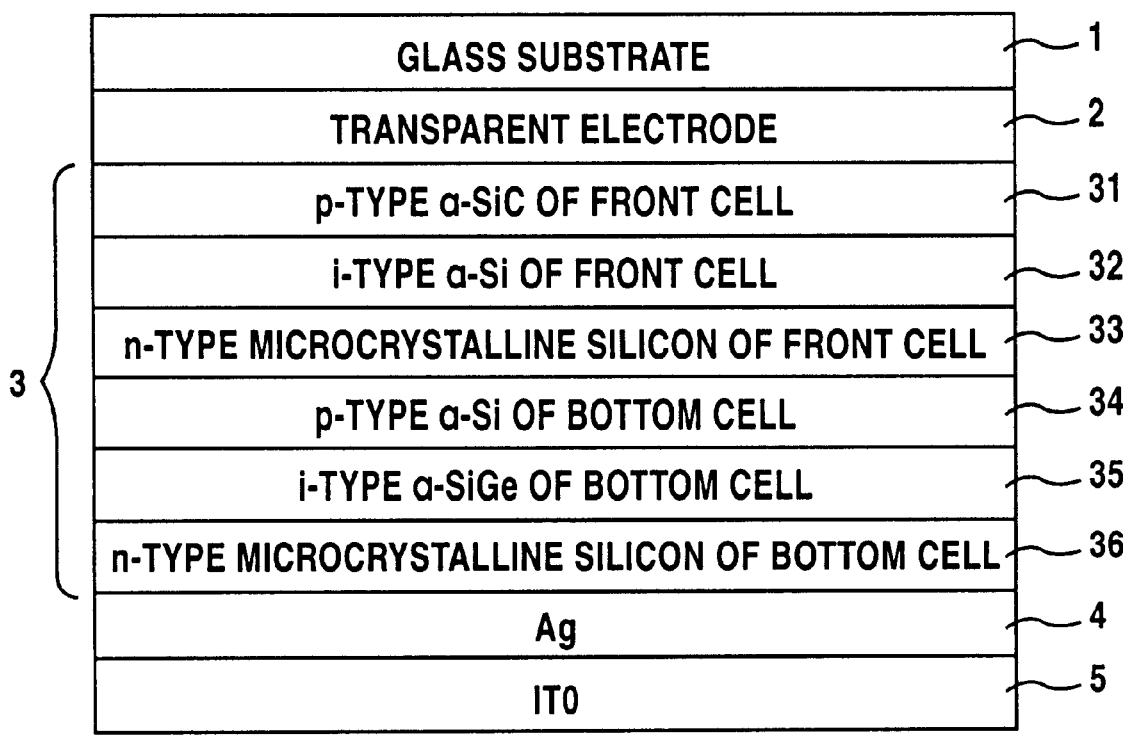
FIG. 2 is an enlarged cross-sectional view of a principal part showing the integration type photovoltaic apparatus according to the present invention.

An amorphous silicon related material film 3 having a total thickness of approximately 0.3 to 0.5 μm which is obtained by laminating an a-Si film of front cell and an a-SiGe film of bottom cell each having a pin junction inside thereof is deposited on the transparent conductive film 2 having photoelectric converting regions formed therein (see FIG. 1B). In the present embodiment, an amorphous silicon related material film 3 having a total thickness of approximately 0.4 μm is formed by plasma CVD. The amorphous silicon related material film 3 comprises a p-type amorphous silicon related alloy film 31 of front cell having a thickness of 300 angstroms composed of a-SiC, an i-type amorphous silicon film 32 of front cell having a thickness of 1000 to 2000 angstroms composed of a-Si, an n-type amorphous silicon related material film 33 of front cell having a thickness of 300 angstroms composed of microcrystalline silicon, a p-type amorphous silicon film 34 of bottom cell having a thickness of 300 angstroms composed of a-Si, an i-type amorphous silicon related alloy film 35 of bottom cell having a thickness of 1000 to 2000 angstroms composed of a-SiGe, and an n-type amorphous silicon related material film 36 of bottom cell having a thickness of 300 angstroms composed of microcrystalline silicon.

Figure 1C:
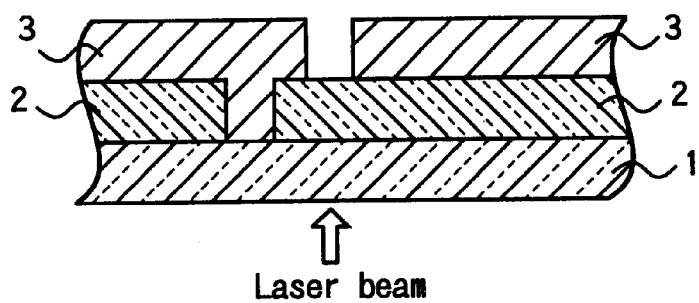

Thereafter, a laser beam is irradiated along a dividing line of the transparent conductive film 2 such that it is not overlapped with the dividing line from the other main surface of the light transmissive insulation substrate 1, to rapidly discharge hydrogen inside the amorphous silicon related material film 3, and the amorphous silicon related material film 3 is removed by the discharge of hydrogen, to divide the amorphous silicon related material film 3 (see FIG. 1C).

Even if the amorphous silicon related material film 3 is not sufficiently separated due to lack of the absolute amount of hydrogen in the amorphous silicon related material film 3 in the case of laser patterning, there is no problem because the transparent conductive film 2 can be electrically connected to a back metal electrode film 4 formed in the subsequent step if a part of the transparent conductive film 2 is exposed.

A back metal electrode film 4 having a thickness of 3000 angstroms selected from materials having an electrical resistivity of not more than 50.0 μΩ·cm at an ordinary temperature (300 K), for example, Au, Ag, Al, Cu, Ti, W, and Ni is then formed by sputtering on the amorphous silicon related material film 3, to connect the transparent conductive film 2 and the back metal electrode film 4. In the present embodiment, Ag is formed by sputtering, to construct the back metal electrode film 4.

Figure 1D:
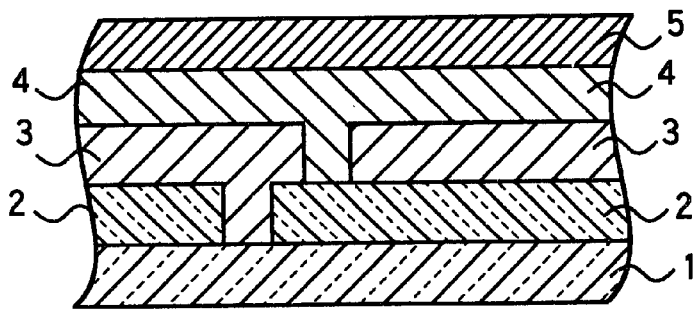

A brittle film 5 composed of a brittle material having higher hardness than that of the back metal electrode film 4, capable of restraining heat deformation, and making it difficult to prevent the removal is formed by sputtering or the like on the back metal electrode film 4 (see FIG. 1D).

A metal material is generally made brittle by including oxygen, nitrogen, carbon, and so forth in its film. As the brittle film, a material selected from a metal oxide film, a metal nitride film, and a metal carbide film may be used. The brittle film 5 can be formed of a material selected from $SnO_2$, $Sn_2O_3$, $In_2Sn_2O_3$, $SnO_2$, $ZnO$, $TiO_2$, $Al_2O_3$, and $SiO_2$, a material selected from AlN, TiN, $Ti_2N$, ZrN, and $Si_3N_4$, or TiC or SiC.

In the present embodiment, the brittle film 5 is formed of ITO ($In_2Sn_2O_3$) having a thickness of 1000 angstroms. The Vickers hardness of the brittle film 5 composed of ITO is 2000 kg/mm².

Figure 1E:
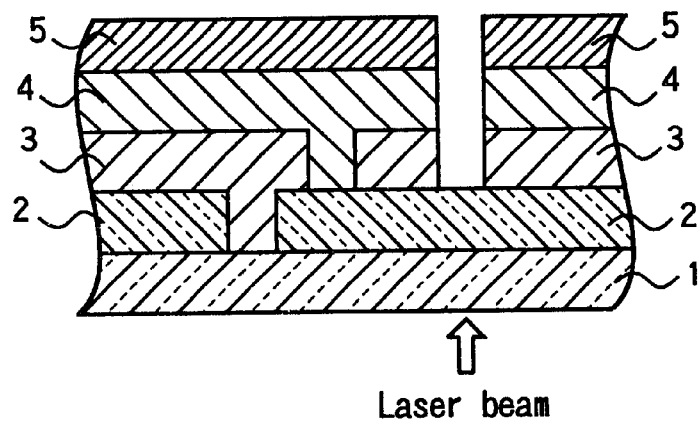
Figure 3A:
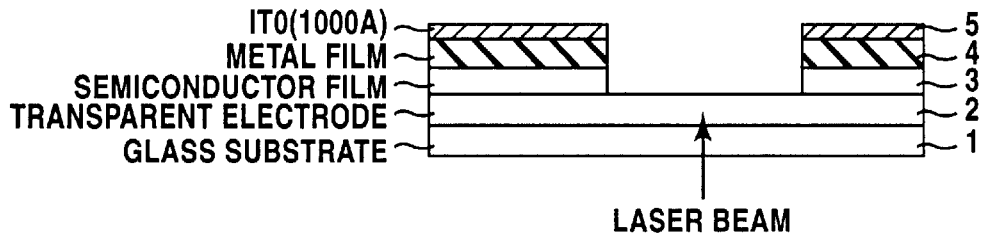
FIG. 3A is a schematic cross-sectional view of a principal part showing a separating portion between cells.
Figure 3B:
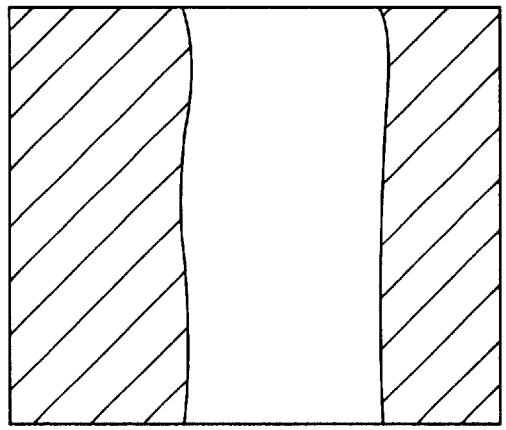
FIG. 3B is a schematic view showing an optical microscopic image in the separating portion between cells.

Thereafter, a processed part of the back metal electrode film 4 is irradiated with a laser beam along dividing lines of the transparent conductive film 2 and the amorphous silicon related material film 3 from the other main surface of the light transmissive insulation substrate 1, to rapidly discharge hydrogen in the amorphous silicon related material film 3 as well as to fuse the back metal electrode film 4 to remove the amorphous silicon related material film 3 and the back metal electrode film 4 formed thereon, thereby separating adjacent cells (see FIG. 1E). At this time, the back metal electrode film 4 is scattered in a state where it is held in the brittle film 5 composed of hard and brittle ITO. Therefore, an end of a separating portion of the back metal electrode film 4 does not warp upward, and a fused scattered material does not adhere to the inside of a separating groove again, so that the back metal electrode film 4 can be separated. When the results of the separation are confirmed by an optical microscopy, the warping at the end is not observed, as shown in FIGS. 3A and 3B. FIG. 3A is a cross-sectional view of a principal part showing a separating portion between cells, and FIG. 3B is a schematic view showing an optical microscopic image in the separating portion between cells.

Figure 4:
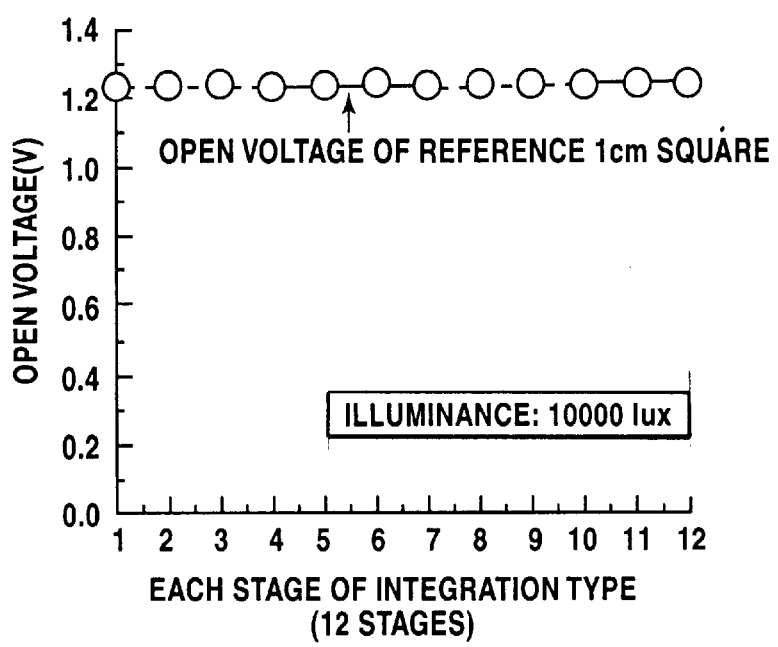
FIG. 4 is a diagram showing the results of measurement of Voc under low illuminance (measurement under a 10000-lux fluorescent lamp) in each of stages of the integration type photovoltaic apparatus according to the present invention.
Figure 5A:
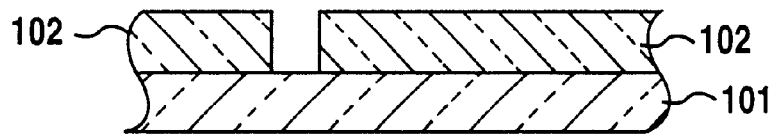
FIGS. 5A to 5E are enlarged cross-sectional views of a principal part showing the steps of a method of fabricating a conventional integration type photovoltaic apparatus.
Figure 5B:
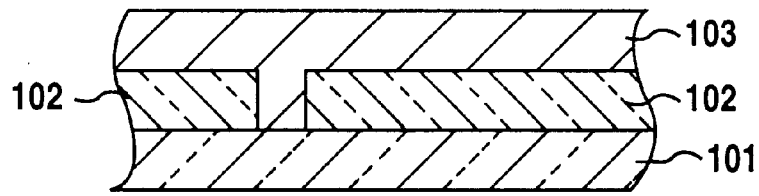
Figure 5C:
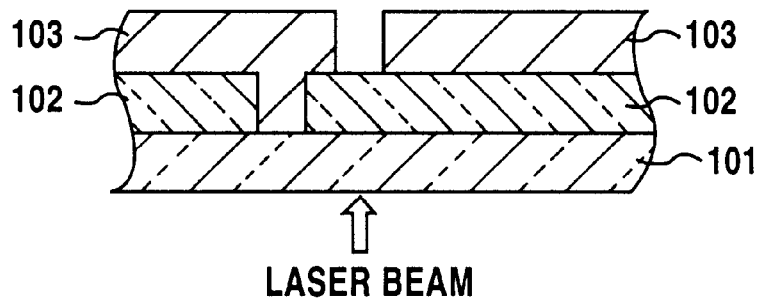
Figure 5D:
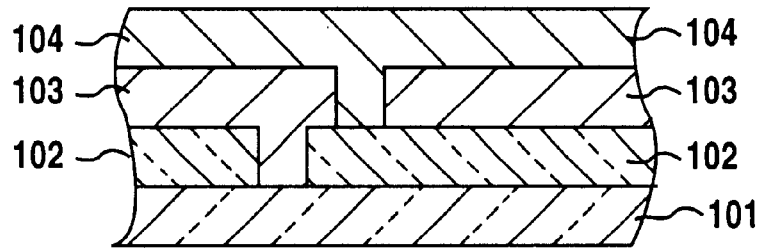
Figure 5E:
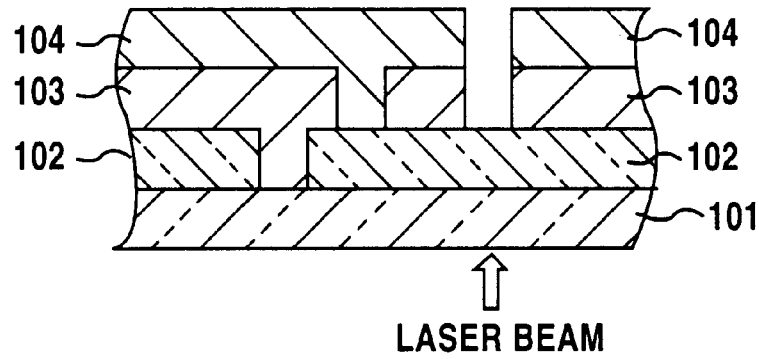
Figure 6A:
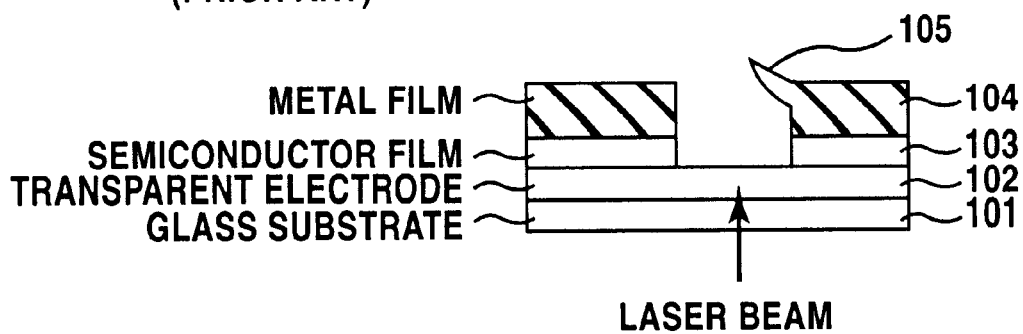
FIG. 6A is a schematic cross-sectional view of a principal part showing a separating portion between cells.
Figure 6B:
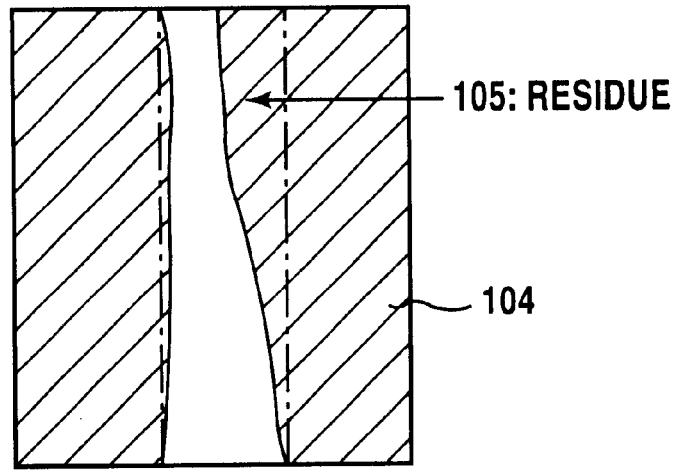
FIG. 6B is a schematic view showing an optical microscopic image in the separating portion between cells.
Figure 7:
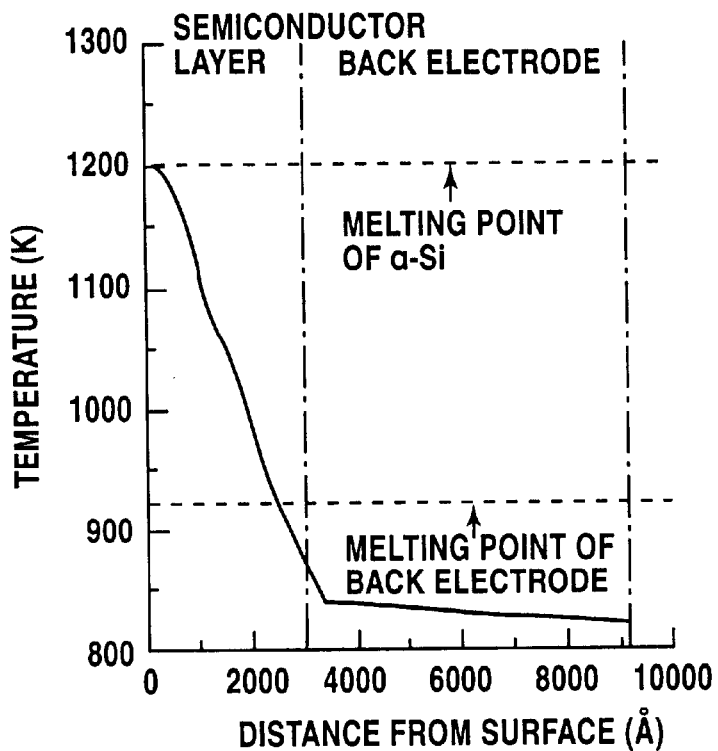
FIG. 7 is a diagram showing the results of simulation of the temperature distribution in the direction of depth in a case where the thickness of a back metal electrode film is 6000 angstroms.
Figure 8:
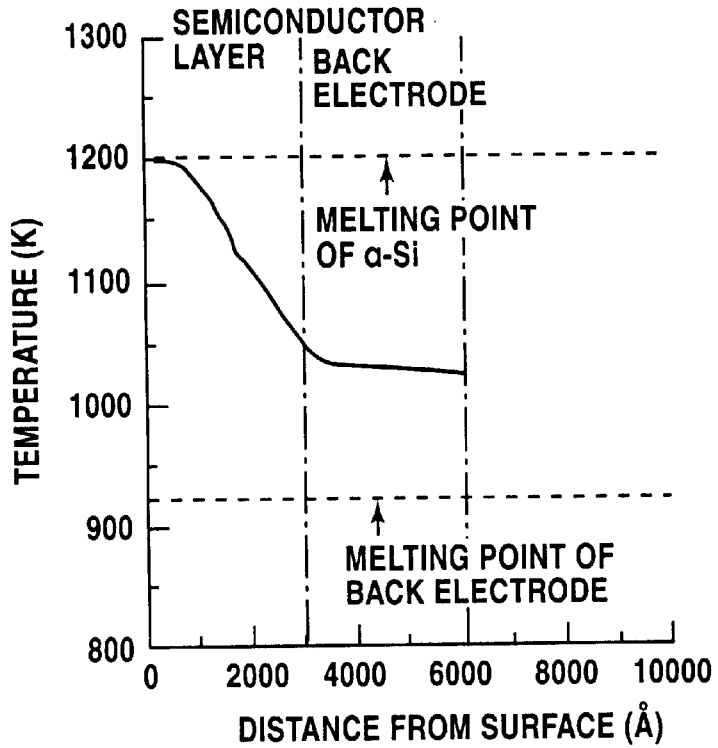
FIG. 8 is a diagram showing the results of simulation of the temperature distribution in the direction of depth in a case where the thickness of a back metal electrode film is 3000 angstroms.
Figure 9A:
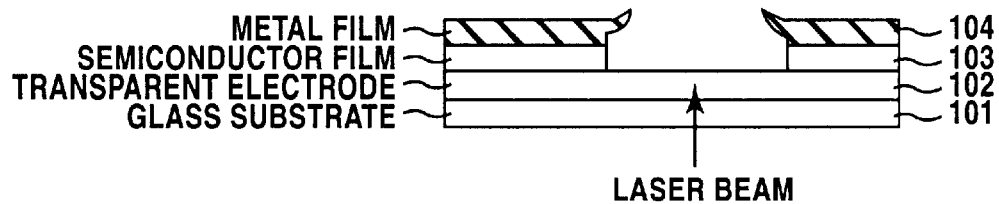
FIG. 9A is a cross-sectional view of a principal part showing a separating portion between cells in a case where a back metal electrode film having a thickness of 3000 angstroms is used.
Figure 9B:
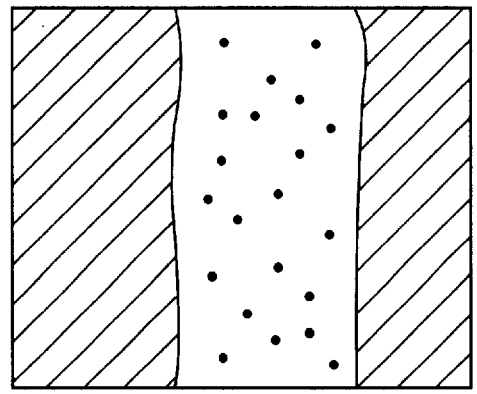
FIG. 9B is a schematic view showing an optical microscopic image in the separating portion between cells.
Figure 10:
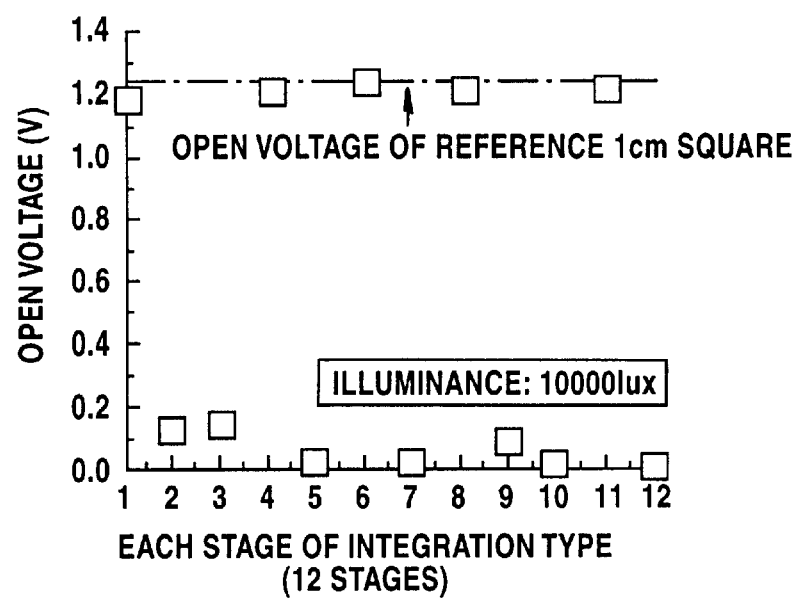
FIG. 10 is a diagram showing the results of measurement of Voc under low illuminance (measurement under a 10000-lux fluorescent lamp) in each of stages of a conventional integration type photovoltaic apparatus.

In order to evaluate the patterning of the back metal electrode film in the integration type photovoltaic apparatus according to the present invention, a photovoltaic apparatus having an integration type a-Si/a-SiGe tandem structure 10 cm square comprised of 12 stages is fabricated, to measure Voc (an open voltage) under low illuminance (measure under a 10000-lux fluorescent lamp) in each of the stages. The results of the measurement of Voc at that time are shown in FIG. 4. As shown in FIG. 4, the open voltage is the same as the open voltage of a reference 1 cm square.

Although in the above-mentioned embodiment, the brittle film 5 composed of a material having high hardness at an ordinary temperature than that of the back metal electrode film 4 is used, the brittle film 5 may be formed of a material having higher hardness than that of the back metal electrode film 4 in at least a fused state because the back metal electrode film 4 may be coated with a film having higher hardness than that of the back metal electrode film 4 when the back metal electrode film 4 is fused by a laser beam.

As described in the foregoing, according to the present embodiment, the back metal electrode film can be reliably processed even if hydrogen in the amorphous silicon related material film is insufficient by thinning the amorphous silicon related material film, so that it is possible to improve the output characteristics of the integration type photovoltaic apparatus.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An integration type photovoltaic apparatus comprising:
   a transparent conductive film divided for each of a plurality of photoelectric converting regions and arranged on a first main surface of a light transmissive insulation substrate;
   an amorphous semiconductor film divided for each of a plurality of photoelectric converting regions and provided on said transparent conductive film;
   a back metal electrode film provided on said amorphous semiconductor film divided by irradiation of the energy beam from a second main surface of said light transmissive insulation substrate; and
   a brittle film provided on said back metal electrode film divided by irradiation of the energy beam from the second main surface of said light transmissive insulation substrate and having higher hardness than that of said back metal electrode film in a fused state, wherein the brittle film provided on said back metal electrode film is divided simultaneously.

2. The integration type photovoltaic apparatus according to claim 1, wherein
   the thickness of said amorphous semiconductor film is not more than 4000 angstroms.

3. The integration type photovoltaic apparatus according to claim 1, wherein
   said back metal electrode film is formed of an electrical conductive material.

4. The integration type photovoltaic apparatus according to claim 3, wherein
   said back metal electrode film is formed of a material selected from Au, Ag, Al, Cu, and Ti.

5. The integration type photovoltaic apparatus according to claim 1, wherein
   said brittle film is formed of a material selected from a metal oxide film, a metal nitride film, and a metal carbide film.

6. The integration type photovoltaic apparatus according to claim 5, wherein
   said brittle film is formed of a material selected from $SnO_2$, $Sn_2O_3$, $In_2Sn_2O_3$, $SnO_2$, $ZnO$, $TiO_2$, $Al_2O_3$, and $SiO_2$.

7. The integration type photovoltaic apparatus according to claim 5, wherein
   said brittle film is formed of a material selected from AlN, TiN, $Ti_2N$, ZrN, and $Si_3N_4$.

8. The integration type photovoltaic apparatus according to claim 5, wherein
   said brittle film is composed of a material selected from TiC and SiC.

9. The integration type photovoltaic apparatus according to claim 1, wherein the amorphous semiconductor film provided on the transparent conductive film are divided by irradiation of an energy beam from the second main surface of said light transmission insulation substrate.

10. The integration type photovoltaic apparatus according to claim 1, wherein the amorphous semiconductor film is an amorphous silicon based material film.

* * * * *